United States Patent [19]

Long

[11] Patent Number: 5,164,725
[45] Date of Patent: Nov. 17, 1992

[54] DIGITAL TO ANALOG CONVERTER WITH CURRENT SOURCES PAIRED FOR CANCELING ERROR SOURCES

[75] Inventor: Teo Y. Long, Singapore, Singapore

[73] Assignee: Tritech Microelectronics International PTE Ltd., Singapore

[21] Appl. No.: 831,508

[22] Filed: Feb. 5, 1992

[51] Int. Cl.[5] .............................................. H03M 1/06
[52] U.S. Cl. ...................................... 341/118; 341/144
[58] Field of Search ................. 341/118, 135, 136, 144

[56] References Cited

U.S. PATENT DOCUMENTS

| | | | |
|---|---|---|---|
| 4,573,005 | 2/1986 | van de Plassche | 323/315 |
| 4,594,577 | 6/1986 | Mao | 341/135 |
| 4,695,826 | 9/1987 | Ando et al. | 341/144 |
| 4,874,964 | 10/1989 | Kondo | 307/270 |
| 5,036,322 | 7/1991 | Barrow et al. | 341/144 |
| 5,084,701 | 1/1992 | Sauerwald | 341/118 |

OTHER PUBLICATIONS

Y. Nakamura, "A 10-b 70 MS/S CMOS D/A Converter", IEEE Journal of Solid State Circuits, vol. 26, No. 4, Apr. 1991, pp. 637-642.

Chu Chong, "A Technique for Improving the Accuracy and the Speed of CMOS Current-Cell DAC", IEEE Transactions on Circuits and Systems, vol. 37, No. 10, Oct. 1990, pp. 1325-1327.

*Primary Examiner*—Marc Hoff
*Attorney, Agent, or Firm*—George O. Saile

[57] ABSTRACT

In a digital to analog converter of the type having an array of current sources that are selected according to a digital input code to produce a current sum that is an analog of the digital code, current sources are arranged in pairs to form a dual current cell. When a dual current cell is selected, it produces two currents of differing magnitudes that are summed on two output busses with corresponding currents from other selected dual cells. These currents are subtracted to form an analog current. The two currents tend to have similar errors from a nominal current value and these errors are canceled by the subtraction. The two current sources of each dual current cell are oppositely switchable between two current levels, and the number of current sources is the minimum number commonly used for arrays of current cells having only one current source.

13 Claims, 3 Drawing Sheets

DIGITAL TO ANALOG CONVERTER WITH CURRENT SOURCES PAIRED FOR CANCELING ERROR SOURCES

FIELD OF THE INVENTION

This invention relates to digital to analog conversion and more specifically to a digital to analog converter that produces a current analog by turning on an appropriate number of similar current sources or weighted current sources.

BACKGROUND OF THE INVENTION

The digital to analog converters that will be discussed in this specification produce a current with a magnitude that represents a digital code. (The current can be converted to a corresponding voltage in various known ways, for example by driving the current through a resistor.) The number of bits in the digital code is significant in the description of the converter and this number of bits is designated "n" for generality.

AN ARRAY OF CURRENT SOURCES

Converters of the type that is shown in the drawing have an array of identical current sources, one current source for each different current level. The invention can also be used with weighted current sources.

Identical current sources are addressable with the binary code that is to be converted, and the corresponding number of current sources are turned on. For example, in response to a binary of 101 (decimal 5), 5 identical current sources are turned on.

Weighted current sources have a current source for each bit position and these current sources have different values. The high order bit position gives a current designated I, the next position gives a current of I/2 and so on. To continue the example of converting the code 101, the current source for the leftmost position would produce the current I, the current source for the next position would be disabled (corresponding to the 0 bit in the code) and the current source for the low order position would produce a current of I/4. Note that I/4 represents a digital 1 and in this example the currents sum to 5 of these units.

The bits of the digital input are decoded to select a number of current sources that represents the code. The currents from these sources are combined in an output bus, and their sum is an analog of the digital input code. (The unselected current sources do not contribute to the output current.)

Consider as an example a circuit with four current sources for converting a two bit code: one current source would be selected to represent the digital code 01, two would be selected to represent code 10, three would be selected to represent code 11, and none would be selected to represent code 00.

CURRENT SOURCE SELECTION

In these converters, a separate set of current sources or weighted current cells is provided for each bit position, one for the first weighted position, 2 for the second weighted position, 4 for the third, and so on. Thus, in general these converters require $2^n - 1$ current sources. The current sources are ordinarily arranged in an array of $2^n$ current sources (with n current sources on each side). Ordinarily the extra current source is formed in the array but is not used.

THE CURRENT CELL

In some of these converters, the current source is part of a more complex circuit called a "current cell." One FET (or other semiconductor device) forms the current source. Its gate is connected to a voltage reference that establishes the value of the current in the source-drain circuit of the FET. Two FETs switch this current source to the output bus or to a dummy bus. The gate of the output FET is connected to the selection circuits to turn on the output FET, and the gate of the dummy FET is connected to a complementary point in the selection circuit or to a potential point that is suitable for turning on the dummy FET when the output FET is turned off.

THE PRIOR ART

This introductory description is based on Nakamura et al. "A 10-b 70-MS/s CMOS D/A Converter", IEEE Journal of Solid-State Circuits, Vol. 26, No. 4. April 1991 Nakamura is also relevant in discussing the sources of errors in these circuits. Nakamura teaches arranging the cells to cancel errors that can be predicted from the location of the cell on a chip.

Chong, A Technique for Improving the Accuracy and the Speed of CMOS Current-Cell DAC also describes these current cells.

U.S. Pat. No. 5,036,322 is also generally similar to the prior art that has been described.

SUMMARY OF THE INVENTION

These analog to digital converters produce errors unless each current source produces an identical current. One object of this invention is to provide a new circuit of this general type that gives a better degree of correction or enhanced error correction.

This converter has two output busses for the current source array, each connected to half of the current sources. A current source connected to one bus is paired for selection with a current source connected to the other bus. Such a pair will be called a dual current cell.

The gates of the output switching FETs of the same dual cell are connected together to the selection logic so that they direct current to the two output busses when the current cell is selected (or they both direct current to the current sink when the cell is unselected). The two currents have different values, and the analog of the digital code is represented by this current difference. These two output currents tend to carry the same errors from the pair current source, and these errors are canceled in a subtraction circuit that forms the analog output.

When a dual current cell is selected, the two sources produce two different current levels on two different output busses. The two current sources of the same cell and their associated current switches are formed close together on the semiconductor chip and thus tend to have similar characteristics and similar errors The two output lines also tend to carry the same noise from other sources.

As the invention has been described so far, n/2 dual cells produce only n/2 current differences whereas n current differences are required. To produce n current differences, as required, each current source is switchable between the two current levels so that either current source can be made the larger source. In the selection circuit, n−1 bits select the corresponding number of dual current cells. The other bit of the code switches the cells to produce the larger current on the selected output bus.

The digital to analog converter also has a biasing circuit that uses feedback to further improve the matching of the current cells.

The digital to analog converter of this invention can be used at frequencies from 0 (d.c) to megahertz; for example it can be used for producing an audio signal from a stored sequence of digital codes.

THE DRAWING

FIGS. 4A and 4B is a schematic of the preferred biasing circuit of this invention wherein FIG. 4A and FIG. 4B show the two alternate switches conditions of the circuit.

THE PREFERRED EMBODIMENT

Figure 1:
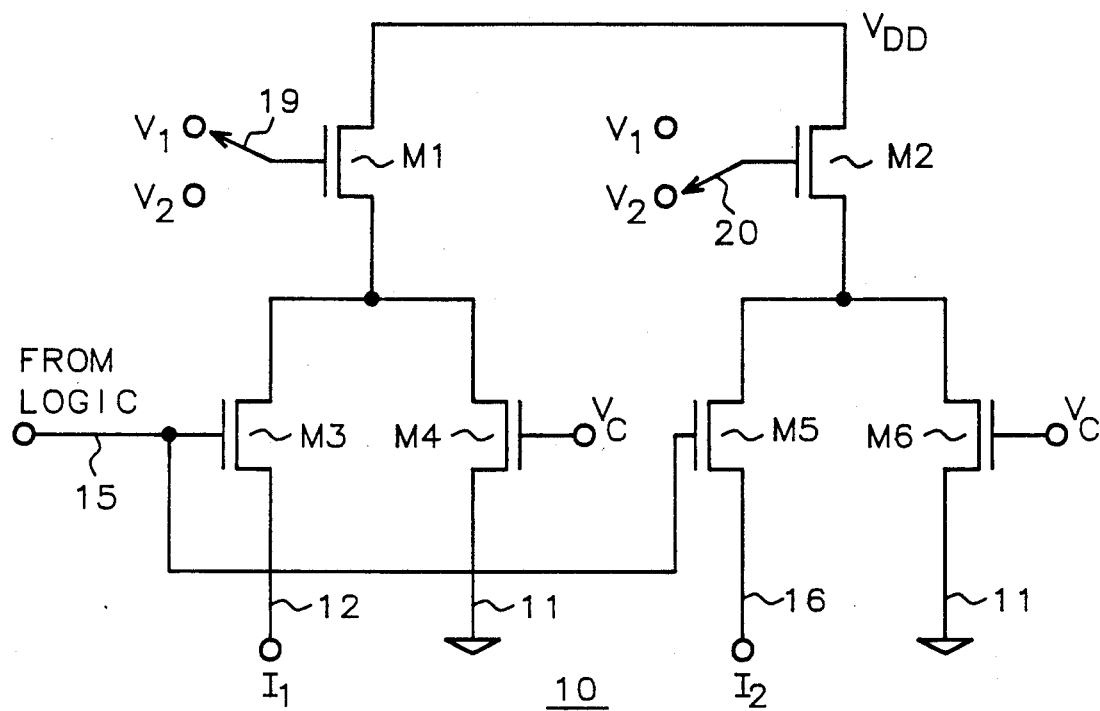
FIG. 1 is a schematic of the dual current cell of this invention.

The Differential Current Cell—FIG. 1

The conventional features of the two current sources and their current switching FETs will be familiar from the description of the prior art. FET M1 forms a current source, described in more detail later, and FET pair M3 and M4 switch the current between a dummy bus 11 and one side 12 of the dual output bus 14, described later. The dummy bus is connected to suitable current sink such as ground. A line 15 connects the gate of the output FET M3 to selection logic (described later). The other switching FET, M4, has its gate connected to a reference point so that the FETs switch oppositely according to the potential on selection line 15 with respect to the reference potential, as is conventional.

FETs M2, M5 and M6 form a current cell that is similar to M1, M3, M4 except that output FET M5 is connected to the opposite side 16 of the dual bus.

Note that the gates of both output FETs M3 and M5 are connected together to selection line 15. Thus, when the dual cell is selected, both of its current sources, M1 and M2, turn on together and produce a current at the drain of each output FET.

The Dual Bus

Figure 3:
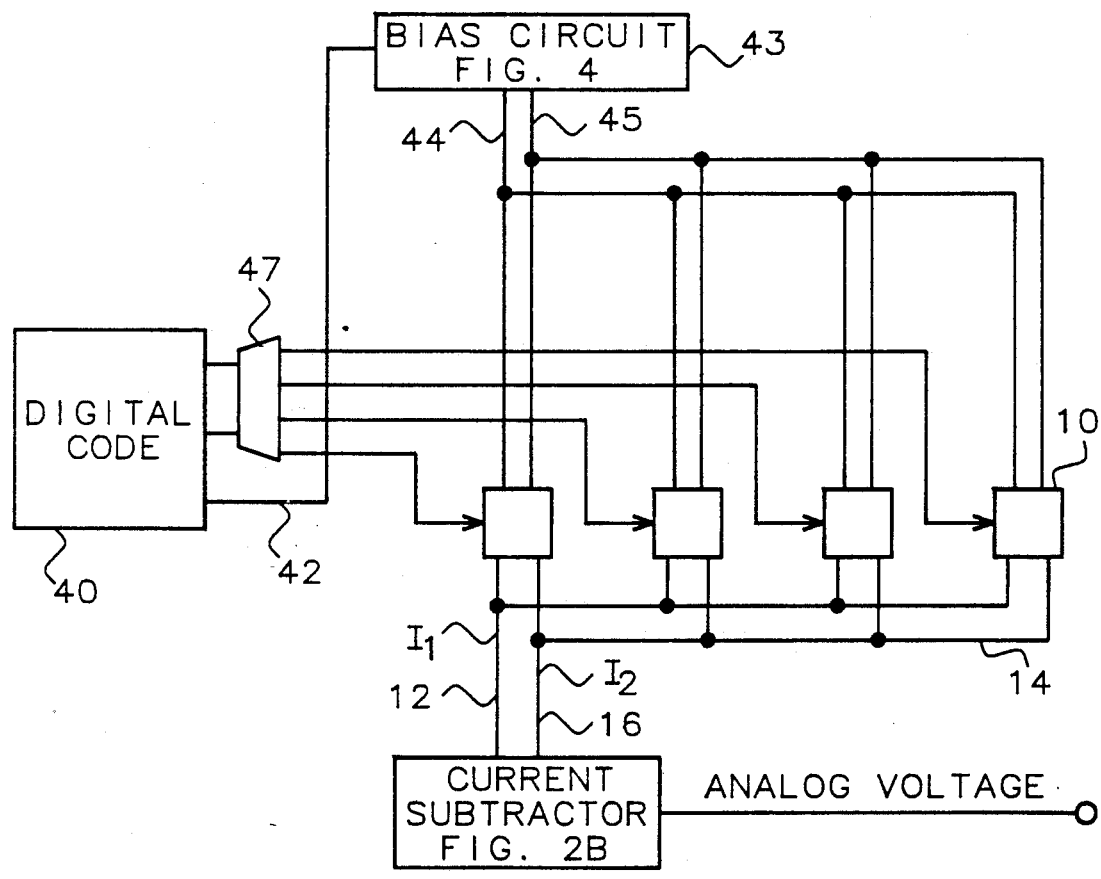
FIG. 3 is a diagram of a selection circuit for an array of 4 dual current cells.

In the prior art all of the output FETs (M3, M5) are connected to a common output bus where the currents are summed. In the dual cell converter circuit, one current in each dual cell is conducted to output bus 12 (like M1 M3) and the other current is conducted to bus 16 (like M2, M5). These additional connections at the drain terminals of the output FETs are shown in FIG. 3. The current in output buss 12 is designated I1 and the current in output buss 16 is designated I2, and it will be convenient to identify the output busses by their current designations.

Switching the Dual Cell Currents

The two current sources of a selected cell oppositely provide one of two different current levels. Preferably the two current levels are established by switching the gate voltage of the current source FETs M1 and M2. (The source terminals of the current sources are connected to a common potential point, as in the prior art.)

The gate terminals of the two current sources are switchably connected to one of two voltage sources, designated V1 and V2. The two switches 19, 20 shown schematically in FIG. 1 are located outside the array of cells and control all of the cells together, as will be described later. Thus, in a single converting operation, all of the selected cells produce the larger cell current on the same side 12 or 16 of the dual output bus and the smaller current on the other side.

The Current Values

The difference between the currents I1 and I2 is the analog of a digital code, and the difference of the two currents produced by a dual current cell is made sufficient to be detected in the current subtraction circuit that will be described later. The two currents are sufficiently close together that the operations of the two current sources are similar so that errors in currents I1 and I2 will be similar and will be canceled in the subtraction circuit. These guides are readily achieved with conventional FETs.

Figure 2A:
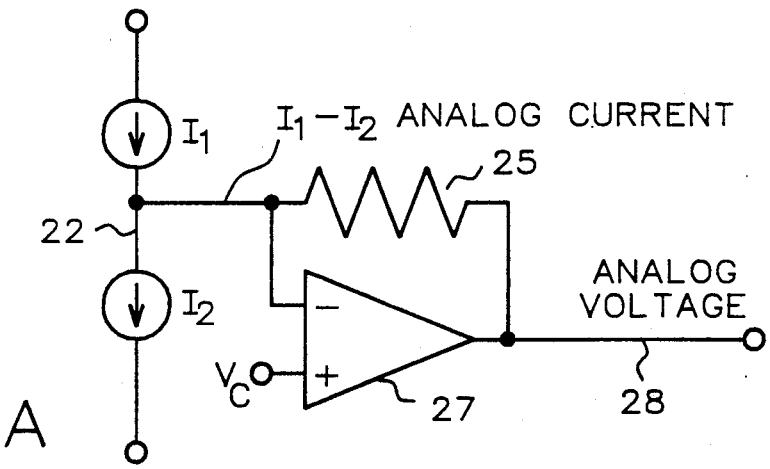
FIG. 2a is a schematic of a simplified subtraction circuit that includes a current to voltage converter.

A Simple Subtraction circuit—FIG. 2a

FIG. 2a is a simple example of this circuit. The currents I1 and I2 are represented schematically as current sources. Current I1 flows into a node 22, current I2 flows out of the node, and the difference current flows in a resistor 25 in the feedback loop of an operational amplifier 27. The operational amplifier maintains the voltage at its output 28 equal to the reference voltage at the non-inverting input plus the drop across resistor 25 (so that the signal at the inverting input equals the reference at the non-inverting input). Thus, the output voltage is the analog of the digital code.

Figure 2B:
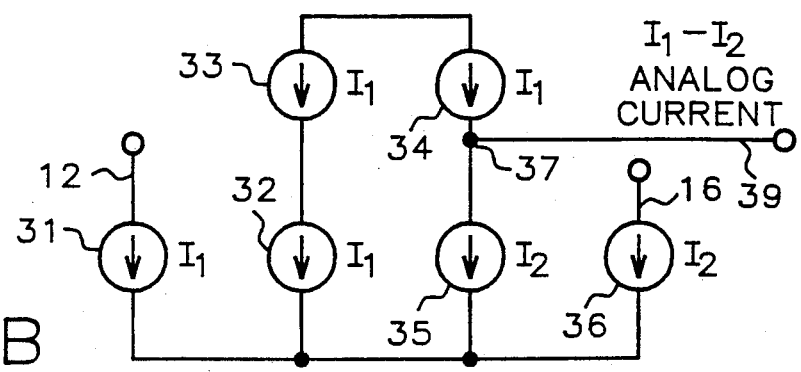
FIG. 2b is a schematic of the preferred subtraction circuit

The Preferred Subtraction Circuit—FIG. 2b

The circuit of FIG. 2B has 6 components, shown schematically as current sources and designated 31–36, which cooperate in pairs to form current mirrors, 31–32, 33–34, and 35–36. A current mirror is a well known circuit in which one device receives a current at an input terminal and the other device produces a current of the same value at the corresponding terminal, which functions as an output terminal.

Output bus current I1 is an input to current mirror component 31 and the associated component 32 produces a corresponding current that is also designated I1. In a corresponding current mirror, a component 36 receives current I2 and a component 35 produces a corresponding current, also designated I2.

Component 33 is connected to receive current I1 from component 32, and component 34 therefore produces current I1 at its output. Node 37 in FIG. 2B corresponds to node 22 in FIG. 2A. Current I1 flows into this node from current mirror element 34; current I2 flows out of this node and into current mirror element 35, and the difference current flows on a line 39.

The current on line 39 can be used directly as the analog of the digital code or it can be converted to an analog voltage by the circuit of FIG. 2A or by well known equivalent circuits.

The Preferred Current Mirror

Preferably a pair of FETs have their source terminals connected to a reference point and their drain terminals connected to form the current input and current output of the mirror circuit. The gate terminals are connected together, and an operational amplifier has its output connected to control the gate voltage. The inverting input of the operational amplifier is connected to a reference potential point and the non-inverting input is connected to the drain terminal of the input FET. The operational amplifier adjusts the gate voltages (at its output) to maintain the drain voltage of the input FET equal to the reference voltage thereby controls the output FET to produce the same current.

The Selection Circuits—FIG. 3

This example has four dual current cells 10 (they are identical) and a total of eight current sources. The dual output bus 14 and the current subtractor circuit will be familiar from the earlier description. Four dual cells produce eight current differences on dual bus, and therefore convert a three bit code which is held in a register 40.

One of these bits, the high order bit, is connected on a line 42 to control the bias circuit 43 to supply voltages on lines 44, 45 that are connected to the gates of the current source FETs as shown in FIG. 1 Circuit 43 can comprise any suitable circuit corresponding functionally to the two switches shown in FIG. 1, but a circuit that adjusts V1 and V2 to maintain $V_{DS}$ of every current source FET to be $V_{OO}/2$ will be described later.

All of the other bits, two bits in this example and n−1 in the general case, are applied to a decoder 47. In the circuit of the drawing, the decoder has four outputs, corresponding to the four logic products of the two input bits, and each decoder output line is connected to a different dual cell. The decoder has the logic function to produce a selection signal at the number of dual cells equal to the value of the n−1 bits at the input of the decoder. For example, if the code is 10 (decimal 2), two cells are selected.

The connection of particular cells to particular outputs of the decoder can be made systematically by considering that particular groups of cells are associated with particular bit positions. In the example of the two bit decoder of the drawing, one dual cell would be selected for both 01 and 11 (the 1's bit position is high in both codes), and two different cells would be selected for 10 and 11 (the 2's position is high in both).

(One of the output lines of the decoder is not used and one of the dual cells was not selected in the example, as has been explained in the introduction of this specification.)

Figure 4A:
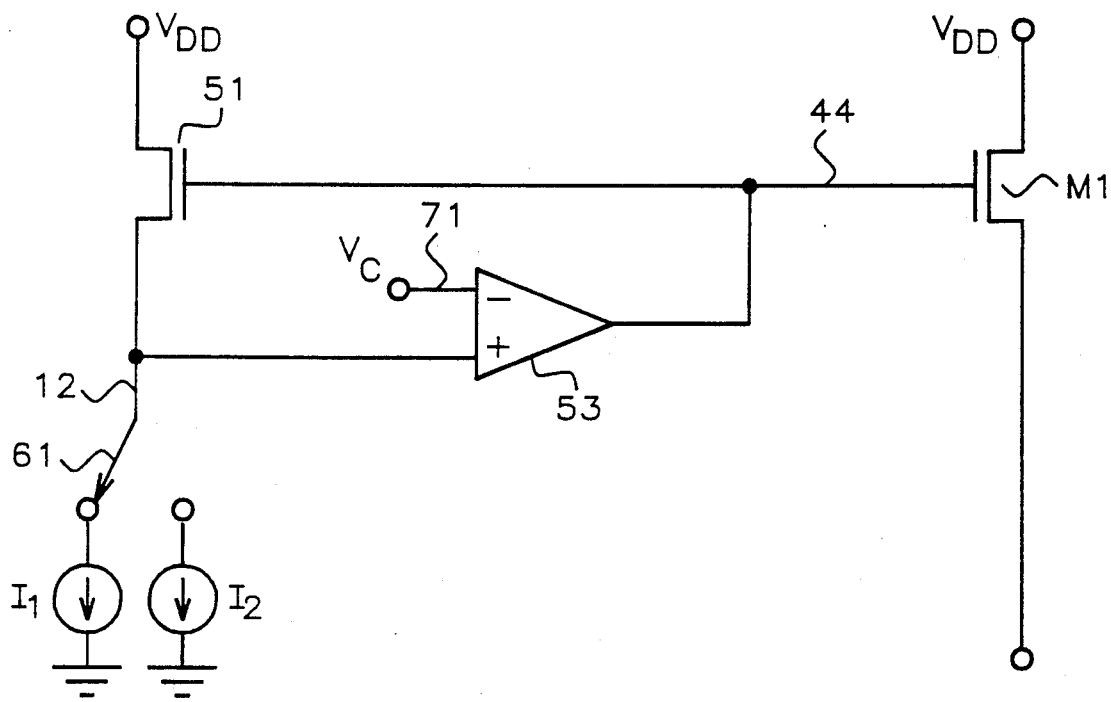
Figure 4B:
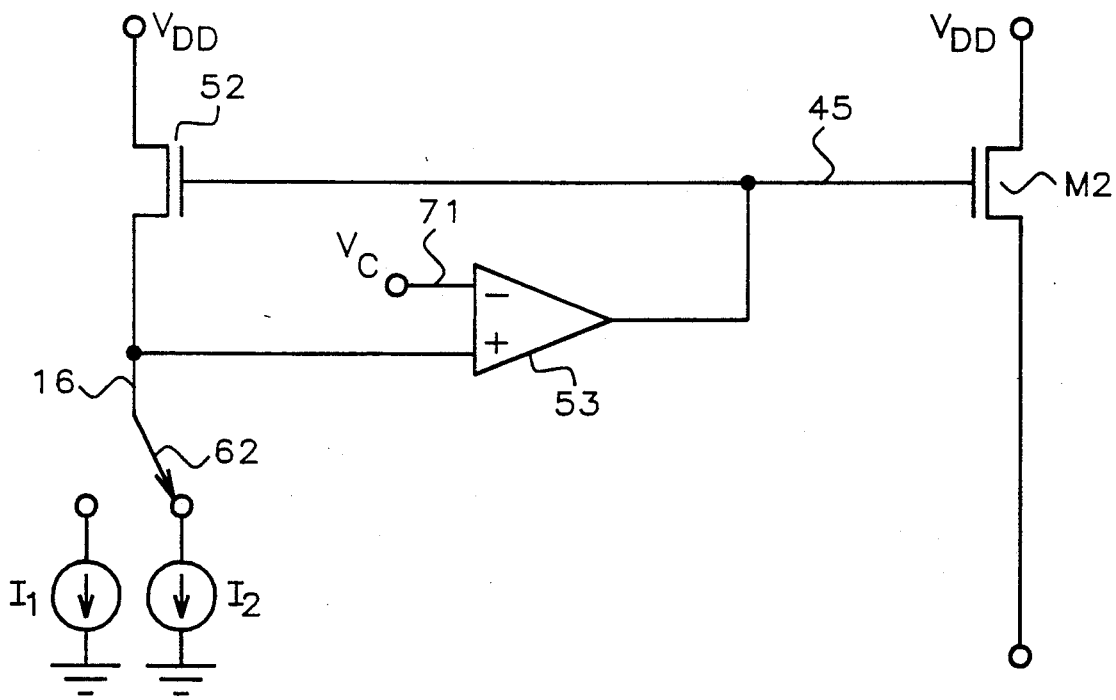

The Biasing Circuit—FIGS. 4A and 4B

FIGS. 4A and 4B shows a circuit for providing the two voltages, V1 and V2 to each dual cell. An FET 51 is connected between the positive power supply terminal VDD and the output bus 12 for current I1. An operational amplifier 53 has its non-inverting input connected to the source terminal of FET 51 and its inverting input connected to a reference voltage. Thus the amplifier adjusts its output to maintain it equal to the voltage at the inverting input and the voltage on line 12.

FIGS. 4A and 4B shows a typical current source FET, M1, and the operational amplifier 53 and FET 51 cooperate with the current source FET M1 in the way described for the two components of the preferred current mirror. The circuit for producing voltage V2 has an FET and an operational amplifier similarly connected to output bus 16.

By switching transistor 51 to either i1 or i2, V1 or V2 will be generated on the gate of M1 or 44. If transistor 51 is connected to I1 transistor 52 should be connected to I2, herefore the voltage at the gate of M1 will be V1 and the gate of M2 will be V2. The switches 61 and 62 are determined by line 42 in FIG. 3. The voltage of Vc, 71, is any DC voltage for proper biasing of transistors 51 and 52.

Other Embodiments

The subtraction circuits of FIGS. 2A and 2B are representative of a wide number of equivalent circuits. The selection circuit of FIG. 3 will suggest a variety of equivalent circuits. From the discussion of connecting the cells in weighted groups for selection, it will be apparent that the dual cell circuit will be useful in implementing digital to analog circuits that use weighted current sources.

Those skilled in the art will recognize other variations if the preferred embodiment within the intended scope of the claims.

I claim:

1. A circuit for converting a digital code of n bits to an analog value, comprising,
   a pair of output busses (14),
   a plurality of current sources (M1, M2), means connecting half of the current sources to one of the output busses and the other half to the other output bus,
   means (47) for selecting pairs of current sources to be turned on according to n−1 bits of the digital code to be converted, one current source of a pair being connected to one output bus and the other current source of the pair being connected to the other output bus, whereby currents (I1 and I2) are produced on the pair of output busses when a pair of current sources is selected,
   means (43) responsive to one bit of the code to be converted to establish a larger current in a selected one of the two current sources of each pair and a smaller current in the other current source, whereby a current difference is produced on the pair of output busses when one or more pairs of current sources are selected, and
   means for subtracting the currents on the two busses to produce an analog value representing the digital code, whereby equal error currents on the pairs of busses cancel.

2. The converting circuit of claim 1 wherein certain pairs of cells correspond to particular bit ones of the n−1 bits of the code to be converted.

3. The converting circuit of claim 2 wherein a pair of current sources has two currents having a difference that is weighted according to the associated bit position of the code to be converted, whereby the converting circuit is a weighted current circuit.

4. The converting circuit of claim 2 wherein the larger current is the same for all current sources and the smaller current is the same for all current sources, whereby the converting circuit is unweighted.

5. The converting circuit of claim 4 wherein a pair of current sources comprises a first current source (M1), a pair of devices (M3, M4) for switching the first current between one of the output busses (12) and a dummy bus, a second current source (M2), and a pair of devices (M5, M6) for switching the second current source between the other one of the output busses (16) and the dummy bus.

6. The converting circuit of claim 5 wherein the devices are FETs.

7. The converting circuit of claim 6 wherein
each current source comprises an FET having its source terminal connected to a common potential point,
and wherein the gate terminal of one FET current source of each pair is connected to one controlling line (44) and the gate terminal of the other FET current source of each pair is connected to another controlling line (45),
and means (43) for oppositely establishing two different voltages on the two controlling lines.

8. The converting circuit of claim 7 wherein the means to establish two different voltages on the two controlling lines comprises a circuit (FIG. 4) for biasing the current source FETs for improved matching.

9. The converting circuit of claim 8 wherein the biasing circuit includes, for each controlling line (44, 45), an FET (51) connected in the associated output bus (12, 16) and an operational amplifier (53) connected in a mirror configuration with said FET (51) and, through the controlling line (44), with the associated current source FETs (M1).

10. The converting circuit of claim 9 wherein the biasing circuit includes means responsive to said one bit of the code to be converted comprises means for switching the operational amplifier to produce a biased voltage of one of two selected levels.

11. The converting circuit of claim 1 wherein the means for subtracting the currents on the two busses comprises means forming a node receiving the two currents in opposition, and means connected to the node for receiving the difference current.

12. The converting circuit of claim 11 wherein the means for receiving the difference current comprises an operational amplifier connected to produce a voltage according to the current difference.

13. The converting circuit of claim 11 wherein the means for receiving the two currents in opposition comprises
a first current mirror for receiving the current (I1) on one output bus and producing a first corresponding current, and a second current mirror for receiving the current (I2) on the other output bus and producing a second corresponding current, and
a third current mirror and connections between the third current mirror and the two outputs of the first and second current mirrors, one of said connections forming said node for the difference current.

* * * * *